United States Patent
Oshima

(10) Patent No.: US 9,742,417 B1
(45) Date of Patent: Aug. 22, 2017

(54) SELF-OSCILLATION CIRCUIT

(71) Applicant: Yokogawa Electric Corporation, Tokyo (JP)

(72) Inventor: Akihiro Oshima, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 15/040,360

(22) Filed: Feb. 10, 2016

(51) Int. Cl.
| | |
|---|---|
| *H03B 5/32* | (2006.01) |
| *H03L 7/099* | (2006.01) |
| *H03L 5/00* | (2006.01) |
| *G01C 19/56* | (2012.01) |
| *G01C 19/5776* | (2012.01) |

(52) U.S. Cl.
CPC ............. *H03L 7/099* (2013.01); *G01C 19/56* (2013.01); *G01C 19/5776* (2013.01); *H03B 5/32* (2013.01); *H03L 5/00* (2013.01)

(58) Field of Classification Search
CPC .. H03L 5/00; H03L 7/099; H03B 5/32; G01C 19/56; G01C 19/5776
USPC ..... 331/182, 183, 175, 154, 158; 73/504.12; 327/306
See application file for complete search history.

(56) References Cited

U.S. PATENT DOCUMENTS

| | | | | |
|---|---|---|---|---|
| 7,528,672 | B2 * | 5/2009 | Darrer ..................... | H03B 1/04 331/116 FE |
| 8,836,444 | B2 * | 9/2014 | Lopez ................ | H03H 9/02433 331/182 |

| | | | |
|---|---|---|---|
| 2007/0049212 | A1 | 3/2007 | Dunworth et al. |
| 2008/0297264 | A1 | 12/2008 | Schwarz et al. |
| 2012/0242389 | A1 | 9/2012 | Sato et al. |
| 2012/0291550 | A1 | 11/2012 | Kato et al. |
| 2014/0174178 | A1 | 6/2014 | Pyo et al. |

FOREIGN PATENT DOCUMENTS

| | | |
|---|---|---|
| EP | 0718631 A2 | 6/1996 |
| JP | S53-135557 A | 11/1978 |
| JP | S55-100316 U | 7/1980 |
| JP | 10-325886 A | 12/1998 |
| WO | 2010/055619 A1 | 5/2010 |
| WO | 2011/102062 A1 | 8/2011 |

OTHER PUBLICATIONS

Extended European Search Report issued on Aug. 2, 2016, by the European Patent Office in counterpart European Application No. 16155454.8.

* cited by examiner

*Primary Examiner* — Arnold Kinkead
(74) *Attorney, Agent, or Firm* — Sughrue Mion, PLLC

(57) ABSTRACT

A self-oscillation circuit includes a vibration unit having a vibrator, a positive feedback path which positively feeds back a signal based on vibration of the vibrator to the vibration unit, a negative feedback circuit which generates a pulse-width-modulated signal having a frequency lower than a vibration frequency of the vibrator, based on a comparison result between a value corresponding to an amplitude of the vibrator and a reference value, and a switch circuit which switches connection and disconnection of the positive feedback path to the vibration unit by the pulse-width-modulated signal.

7 Claims, 8 Drawing Sheets

SELF-OSCILLATION CIRCUIT

BACKGROUND

Technical Field

The present invention relates to a self-oscillation circuit for oscillating a vibrator by a positive feedback circuit.

Related Art

A capacitive vibration type pressure/differential pressure sensor or the like includes a self-oscillation circuit for oscillating a vibrator at a resonance frequency. FIG. 8 is a view showing a configuration example of a related-art capacitive vibration type self-oscillation circuit. As shown in FIG. 8, a self-oscillation circuit 500 includes a positive feedback circuit for oscillating a vibrator 511 and a negative feedback circuit for controlling oscillation amplitude of the vibrator 511.

The positive feedback circuit is formed in a loop passing through the vibrator 511, a second fixed electrode 513, an I/V converter 520, an inverting amplifier 530 and a variable-gain amplifier 560 from a first fixed electrode 512. Generally, the vibrator 511 is vacuum-sealed in order to increase a value of Q.

The negative feedback circuit is formed in a circuit passing through an absolute value circuit 540 for detecting an absolute value of a signal outputted from the inverting amplifier 530, an error amplifier 550, and the variable-gain amplifier 560.

In the positive feedback circuit, the vibrator 511 is fixed to a GND potential, and a bias voltage VBIAS is applied to the first fixed electrode 512 and the second fixed electrode 513 via a DC voltage source. At this time, a charge corresponding to capacitance is charged between the vibrator 511 and the first fixed electrode 512, and between the vibrator 511 and the second fixed electrode 513.

In addition to the bias voltage VBIAS, an output voltage VGAO of the variable-gain amplifier 560 is applied to the first fixed electrode 512. The vibrator 511 vibrates in accordance with the potential change of the first fixed electrode 512.

As the vibrator 511 vibrates, the charging and discharging of the charge occurs, and a current output signal from the second fixed electrode 513 is inputted to the I/V converter 520 and is outputted as a voltage signal IVO. The voltage signal IVO is inverted and amplified in the inverting amplifier 530 and is outputted as a voltage signal INVO. The voltage signal INVO is amplified in the variable-gain amplifier 560 and is applied, as the voltage signal VGAO, to the first fixed electrode 512. Such positive feedback circuit allows the vibrator 511 to vibrate at its own resonance frequency.

In the negative feedback circuit, the amplitude of the voltage signal INVO outputted from the inverting amplifier 530 is detected by the absolute value circuit 540. The absolute value circuit 540 can be configured by using a full-wave rectifier circuit or the like. A voltage signal ABSO outputted from the absolute value circuit 540 corresponds to oscillation amplitude of the vibrator 511.

A difference between the voltage signal ABSO and a reference voltage VCONT is detected, as an error signal ERRO, in the error amplifier 550, and the gain of the variable-gain amplifier 560 is changed by the error signal ERRO. In the case of FIG. 8, the gain of the variable-gain amplifier 560 is increased when the amplitude of the vibrator 511 is small and the error signal ERRO is great, and the gain of the variable-gain amplifier 560 is decreased when the amplitude of the vibrator 511 is great and the error signal ERRO is small. As the gain of the variable-gain amplifier 560 is adjusted, the amplitude of the vibrator 511 is normally controlled to be constant.

Patent Document 1: International Publication WO 2011/102062

When such self-oscillation circuit 500 is applied to an apparatus that requires low power consumption, such as, for example, two-wire type instrument, it is necessary to constitute the self-oscillation circuit by an ASIC where it is easy to achieve low power consumption. The reason is that it is difficult to satisfy the low power consumption specification when the self-oscillation circuit is configured by a discrete component.

However, in the related-art self-oscillation circuit 500, a gain of the variable-gain amplifier 560, which is used in the positive feedback, is changed by the output of the negative feedback circuit. Therefore, the positive feedback circuit and the negative feedback circuit have a mutually dependent relationship, and hence, the interface therebetween becomes complicated. Accordingly, a strict adjustment between the positive feedback circuit and the negative feedback circuit is required. For example, when the design changes to the IN converter 520 and the inverting amplifier 530 occur, the design of the variable-gain amplifier 560 should be also changed. This causes an increase in the design man-hours and acts as a barrier to the ASIC.

SUMMARY

Exemplary embodiments of the invention provide a self-oscillation circuit without using a variable-gain amplifier that complicates an interface between a positive feedback circuit and a negative feedback circuit.

A self-oscillation circuit according to an exemplary embodiment, comprises:
a vibration unit having a vibrator;
a positive feedback path which positively feeds back a signal based on vibration of the vibrator to the vibration unit;
a negative feedback circuit which generates a pulse-width-modulated signal having a frequency lower than a vibration frequency of the vibrator, based on a comparison result between a value corresponding to an amplitude of the vibrator and a reference value; and
a switch circuit which switches connection and disconnection of the positive feedback path to the vibration unit by the pulse-width-modulated signal.

The self-oscillation circuit may further comprise:
a synchronization unit which synchronizes the signal based on the vibration of the vibrator with a switching timing of the switch circuit.

The self-oscillation circuit may further comprise:
a buffer provided in the positive feedback path, the buffer being switched between an enable state and a disable state by the pulse-width-modulated signal.

The negative feedback circuit may generate the pulse-width-modulated signal such that the greater a difference between the value corresponding to the amplitude of the vibrator and the reference value is, the longer a pulse width is.

The negative feedback circuit may include an error amplifier which compares the value corresponding to the amplitude of the vibrator with the reference value to output an error signal, and a PWM unit which performs pulse-width-modulation of the error signal.

The PWM unit may include a triangular wave oscillator which outputs a triangular wave having a frequency lower than the vibration frequency of the vibrator, and a comparator which compares the error signal with the triangular wave to generate the pulse-width-modulated signal.

The negative feedback circuit may include an AD converter which digitally converts the value corresponding to the amplitude of the vibrator, a digital error detection unit which compares the digitized value with the reference value to detect an error, a digital PWM unit which performs pulse width modulation of the detected error.

The digital error detection unit may include a subtractor which calculates a difference between the digitized value and the reference value and a digital filter which controls the digital PWM unit according to the difference.

According to the present invention, it is possible to achieve a self-oscillation circuit without using a variable-gain amplifier.

DETAILED DESCRIPTION

Figure 1:
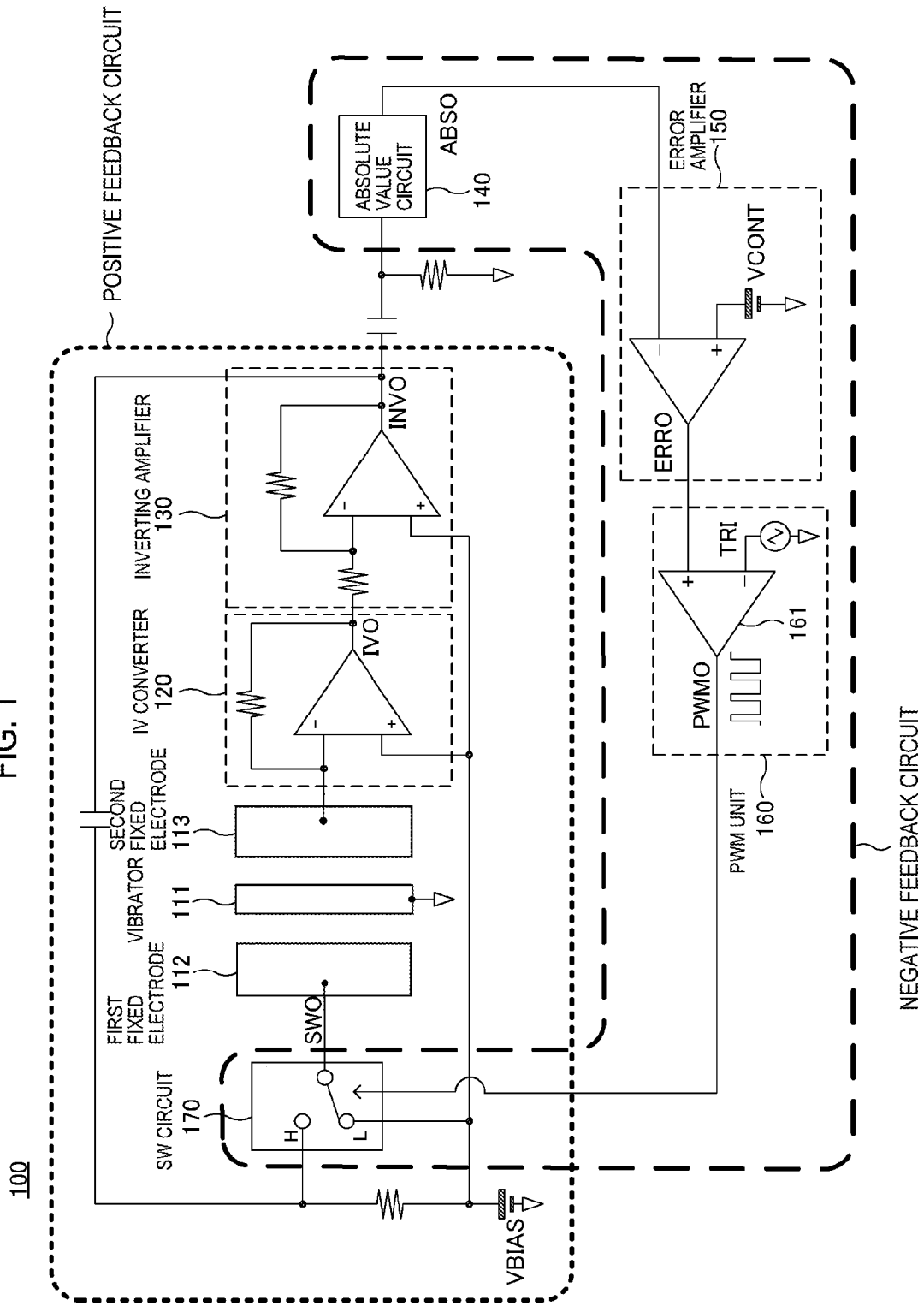
FIG. 1 is a view showing a configuration of a self-oscillation circuit according to a first embodiment of the present invention.

Exemplary embodiments of the present invention will be described with reference to the drawings. FIG. 1 is a view showing a configuration of a self-oscillation circuit 100 according to a first embodiment of the present invention. Meanwhile, the self-oscillation circuit of the present invention is not limited to a capacitive vibration type self-oscillation circuit, but can be applied to various self-oscillation circuits having a positive feedback circuit.

As shown in FIG. 1, the self-oscillation circuit 100 of the first embodiment includes a positive feedback circuit for oscillating a vibrator 111, and a negative feedback circuit for controlling oscillation amplitude of the vibrator 111.

The positive feedback circuit is formed in a loop passing through the vibrator 111, a second fixed electrode 113, an IN converter 120, an inverting amplifier 130 and a SW circuit 170 from a first fixed electrode 112. Generally, the vibrator 111 is vacuum-sealed in order to increase a value of Q. Meanwhile, the first fixed electrode 112, the vibrator 111 and the second fixed electrode 113 constitute a vibration unit. A positive feedback path is configured by a path that extends from an output of the inverting amplifier 130 to an input of the first fixed electrode 112 via the SW circuit 170.

The negative feedback circuit is formed in a circuit passing through an absolute value circuit 140 for detecting an absolute value of a voltage signal INVO outputted from the inverting amplifier 130, an error amplifier 150, a PWM unit 160, and the SW circuit 170.

The SW circuit 170 is switched and controlled by an output signal PWMO of the PWM unit 160. Specifically, when the output signal PWMO is H, the voltage signal INVO outputted from the inverting amplifier 130 is fed back to the first fixed electrode 112 to form a positive feedback loop of the positive feedback circuit. Further, when the output signal PWMO is L, the positive feedback loop of the positive feedback circuit is released.

In the positive feedback circuit, the vibrator 111 is fixed to a GND potential, and a bias voltage VBIAS is applied to the first fixed electrode 112 and the second fixed electrode 113 via a DC voltage source, regardless of the state of the SW circuit 170. At this time, a charge corresponding to capacitance is charged between the vibrator 111 and the first fixed electrode 112, and between the vibrator 111 and the second fixed electrode 113.

When the output signal PWMO is H, the positive feedback loop is formed by the SW circuit 170. Therefore, in addition to the bias voltage VBIAS, the voltage signal INVO outputted from the inverting amplifier 130 is applied to the first fixed electrode 112 and the vibrator 111 vibrates according to the potential change of the first fixed electrode 112.

As the vibrator 111 vibrates, the charging and discharging of the charge occurs, and a current output signal from the second fixed electrode 113 is inputted to the IN converter 120 and is outputted as a voltage signal IVO. The voltage signal IVO is inverted and amplified in the inverting amplifier 130 and is outputted as the voltage signal INVO. Such positive feedback circuit allows the vibrator 111 to vibrate at its own resonance frequency.

In the negative feedback circuit, the amplitude of the voltage signal INVO outputted from the inverting amplifier 130 is detected by the absolute value circuit 140. The absolute value circuit 140 can be configured by using a full-wave rectifier circuit or the like. A voltage signal ABSO outputted from the absolute value circuit 140 corresponds to the oscillation amplitude of the vibrator 111.

A difference between the voltage signal ABSO and a reference voltage VCONT is detected, as an error signal ERRO, in the error amplifier 150. The error signal ERRO is pulse-width-modulated by the PWM unit 160 and is outputted as a PWMO signal.

Figure 2:
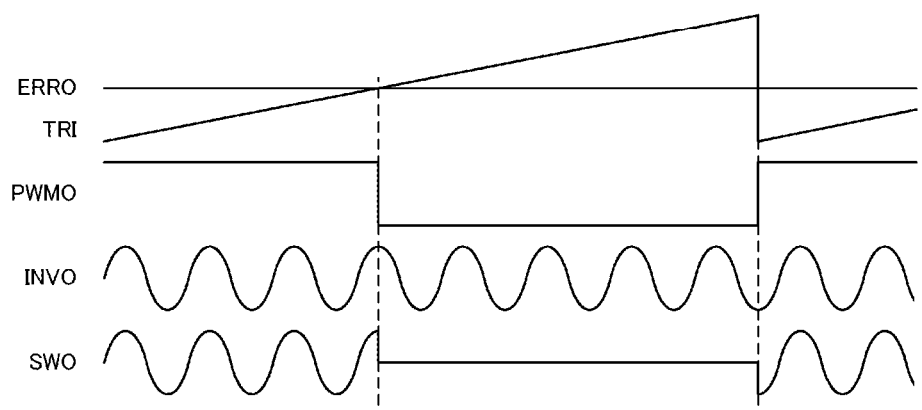
FIG. 2 is a waveform diagram for explaining an operation of a PWM unit.

As shown in FIG. 2, the error signal ERRO can be compared with a triangular wave (a saw-toothed wave) TRI by a comparator 161, thereby generating the PWMO signal. At this time, as the frequency of the pulse width modulation, i.e., the frequency of the triangular wave, a frequency lower than the resonance frequency of the vibrator 111 is used. The reason is that a positive feedback loop formation period is sufficiently secured with respect to the vibration cycle and the vibrator 111 is stably oscillated.

The smaller the amplitude of the vibrator 111 is and the greater the error signal ERRO is, the longer the H pulse width of the PWMO signal in each cycle is. Further, the greater the amplitude of the vibrator 111 is and the smaller the error signal ERRO is, the shorter the H pulse width of the PWMO signal in each cycle is.

When the PWMO signal is H, i.e., when the error signal ERRO is greater than the triangular wave the positive feedback loop is formed, and thus, the amplitude of the vibrator 111 is grown. On the other hand, when the PWMO signal is L, i.e., when the error signal ERRO is smaller than the triangular wave TRI, the positive feedback loop is released, and thus, the amplitude of the vibrator 111 is attenuated. As the growth and attenuation of the amplitude is repeated, the amplitude of the vibrator 111 is normally controlled to be constant.

As described above, the Q of the vibrator 111 is generally designed to be relatively high. Therefore, with respect to the oscillation cycle of the vibrator 111, the growth and attenuation of the amplitude is very gentle. Accordingly, even when the vibrator 111 is intermittently operated by the SW circuit 170, the hunting width of the amplitude of the vibrator 111 can be reduced and the amplitude can be normally controlled to be almost constant.

According to the self-oscillation circuit 100 of the first embodiment, the variable-gain amplifier that complicates the interface between the positive feedback circuit and the negative feedback circuit is not necessary, and the positive feedback circuit and the negative feedback circuit are disconnected, so that the interface adjustment between the circuits is simplified. That is, the characteristics on the positive feedback circuit side are uniquely determined by the design of the IN converter 120 and the inverting amplifier 130, and the characteristics on the negative feedback circuit side are uniquely determined by the design of the error amplifier 150 and the PWM unit 160. In this way, the positive feedback circuit and the negative feedback circuit can be independently adjusted. As a result, the design man-hours can be reduced and the ASIC is easily achieved. Furthermore, instead of the variable-gain amplifier that lacks of versatility, the PWM unit 160, which can be configured by a versatile comparator and a versatile triangular wave oscillator, is used. Therefore, it is also possible to achieve the easy mounting, the low voltage and the low consumption power.

Figure 3:
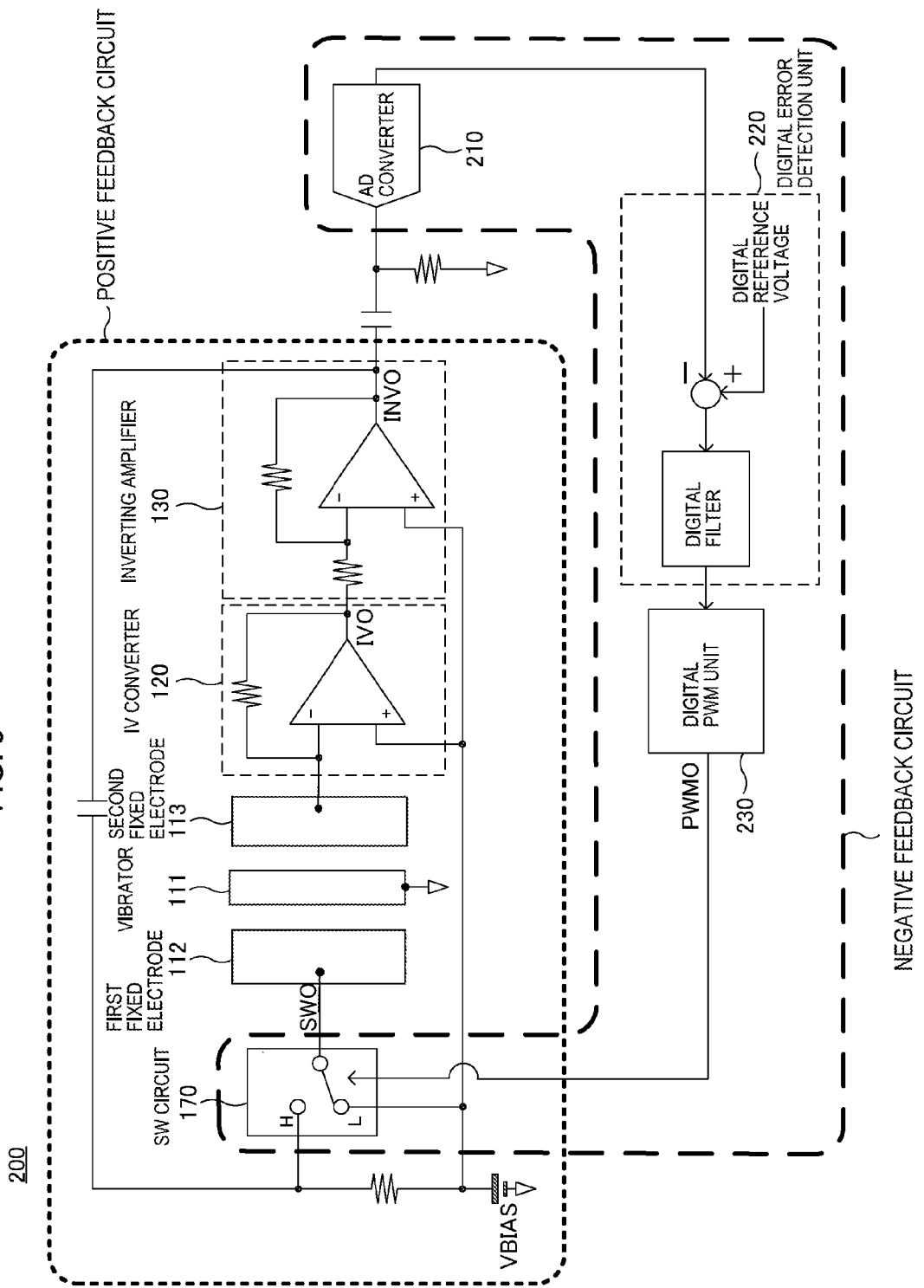
FIG. 3 is a view showing a configuration of a self-oscillation circuit according to a second embodiment of the present invention.

FIG. 3 is a view showing a configuration of a self-oscillation circuit 200 according to a second embodiment of the present invention. As shown in FIG. 3, the self-oscillation circuit 200 of the second embodiment also includes a positive feedback circuit for oscillating the vibrator 111, and a negative feedback circuit for controlling oscillation amplitude of the vibrator 111. However, in the self-oscillation circuit 200 according to the second embodiment, the negative feedback circuit is digitized.

Since the positive feedback circuit is similar to that of the first embodiment, the positive feedback circuit is denoted by the same reference numeral. Namely, the positive feedback circuit is formed in a loop passing through the vibrator 111, the second fixed electrode 113, the UV converter 120, the inverting amplifier 130 and the SW circuit 170 from the first fixed electrode 112.

The negative feedback circuit is forming in a circuit passing through an AD converter 210 for digitally converting the voltage signal INVO outputted from the inverting amplifier 130, a digital error detection unit 220 for comparing the digitized value with a reference value and detecting an error, a digital PWM unit 230 for performing the pulse width modulation of the detected error, and the SW circuit 170. For example, the digital error detection unit 220 can be configured by a subtractor for calculating a difference between the digitized value and the digital reference voltage and a digital filter for controlling the digital PWM unit 230 according to the error.

The SW circuit 170 is switched and controlled by the output signal PWMO of the digital PWM unit 230. Specifically, the positive feedback loop of the positive feedback circuit is formed when the output signal PWMO is H, and the positive feedback loop of the positive feedback circuit is released when the output signal PWMO is L.

Although the negative feedback circuit of the self-oscillation circuit 200 of the second embodiment is digitized, a basic operation principle of the self-oscillation circuit 200 is similar to the self-oscillation circuit 100 of the first embodiment. Since, in addition to the characteristics of the self-oscillation circuit 100 of the first embodiment, the self-oscillation circuit 200 of the second embodiment is configured such that an analog circuit element is omitted, the design man-hours can be further reduced. Further, since the integration degree of the analog circuit in the ASIC is lowered, the production cost can be reduced.

Figure 4:
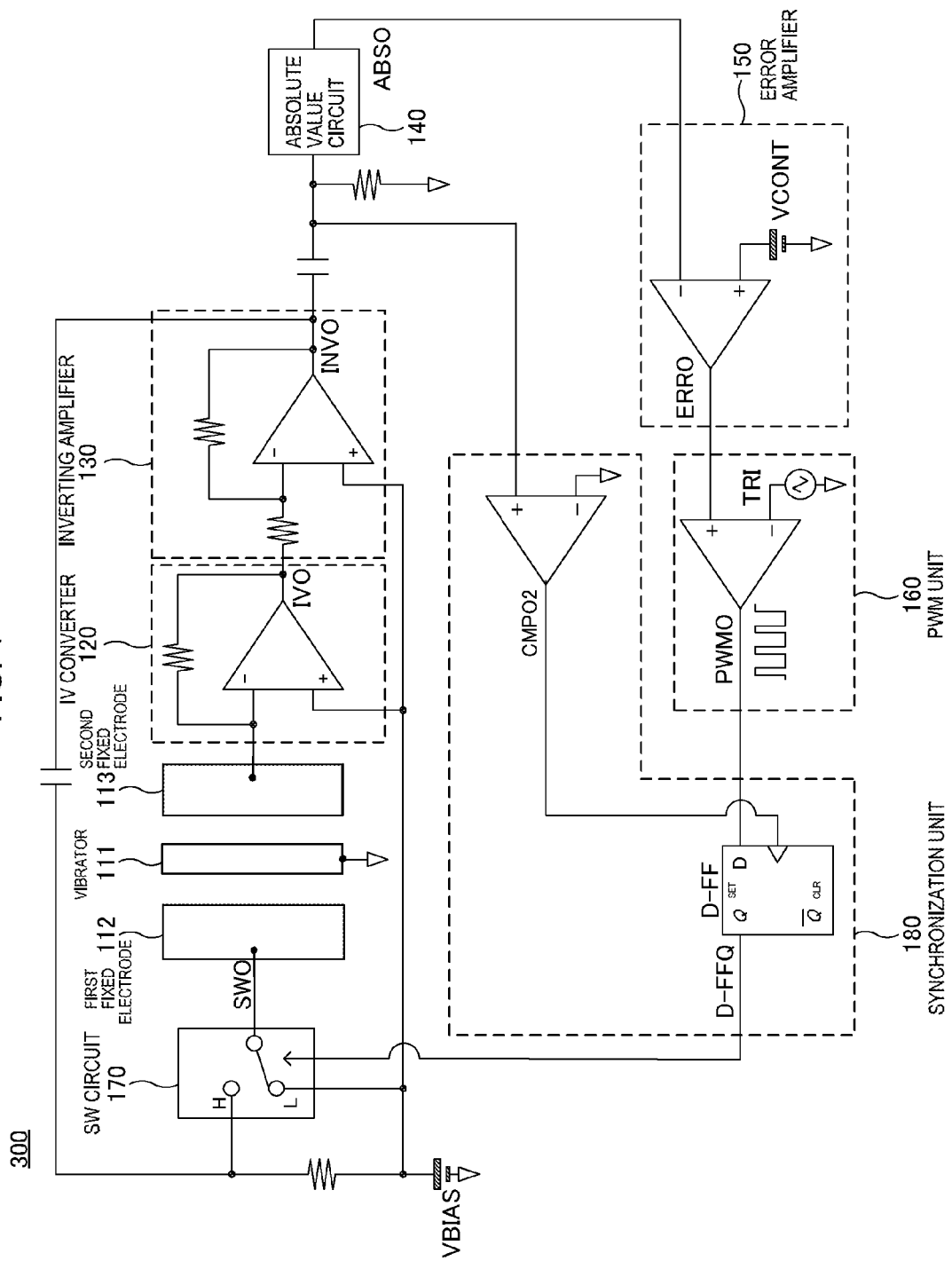
FIG. 4 is a view showing a configuration of a self-oscillation circuit according to a third embodiment of the present invention.

FIG. 4 is a view showing a configuration of a self-oscillation circuit 300 according to a third embodiment of the present invention. As shown in FIG. 4, the self-oscillation circuit 300 of the third embodiment has a configuration that a synchronization unit 180 is additionally provided to the self-oscillation circuit 100 of the first embodiment. Meanwhile, the synchronization unit 180 may be additionally provided to the self-oscillation circuit 200 of the second embodiment.

The synchronization unit 180 includes a comparator and a D-FF and is configured such that the SW circuit 170 is switched at the timing when the voltage signal INVO (AC component) outputted from the inverting amplifier 130 is changed from negative to positive. Specifically, at the timing when the voltage signal INVO (AC component) is changed from negative to positive, i.e., when a voltage signal SWO is equal to the bias voltage VBIAS, the comparator outputs a CMPO2 signal (voltage rise) to operate the D-FF. Further, the SW circuit 170 is switched by a D-FFQ signal outputted from the D-FF. It is noted that the switching may be performed at the timing when the voltage signal INVO is changed from positive to negative or at the timing of every half cycle.

When the synchronization unit 180 is not provided, the switching of the SW circuit 170 is not synchronized with the vibration of the vibrator 111. Therefore, at the time of the switching of the SW circuit 170, sudden variation occurs in the voltage signal SWO applied to the first fixed electrode 112, and hence, the voltage signal SWO is often disturbed.

Figure 5:
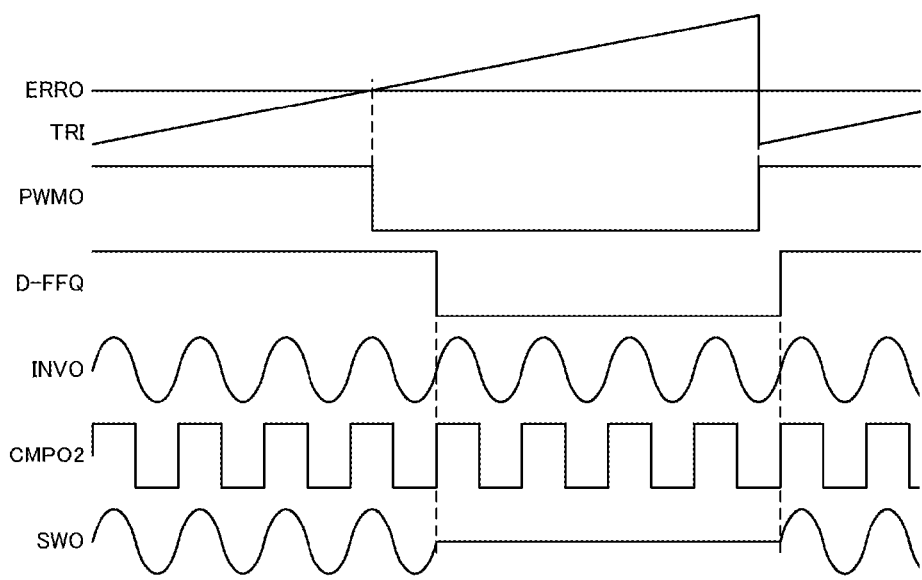
FIG. 5 is a waveform diagram for explaining an operation of a synchronization unit.

On the contrary, when the synchronization unit 180 is provided, the switching of the SW circuit 170 is synchronized with the vibration of the vibrator 111, as shown in FIG. 5. Namely, the SW circuit 170 is switched when the voltage signal SWO is equal to the bias voltage VBIAS. As a result, at the time of the switching of the SW circuit 170, sudden variation does not occur in the voltage signal SWO, and hence, the disturbance of the voltage signal SWO can be reduced.

Figure 6A:
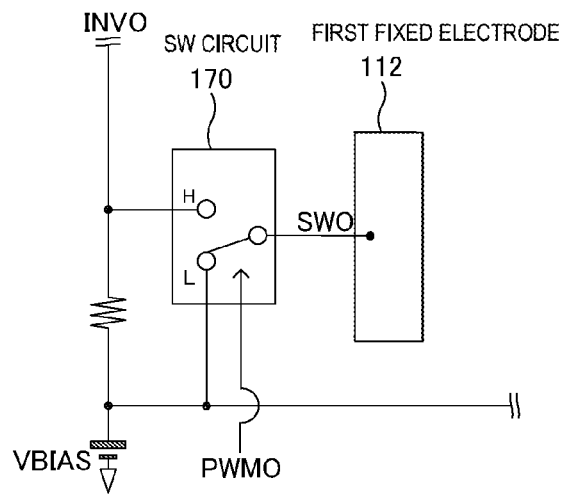
FIGS. 6A to 6C are views showing a modified example of each embodiment.

Meanwhile, in each of the above-described embodiments, the bias voltage VBIAS is applied to the first fixed electrode 112 via the SW circuit 170, as shown in FIG. 6A. In this case, both an H terminal and an L terminal of the SW circuit 170 are connected to a DC voltage source.

Figure 6B:
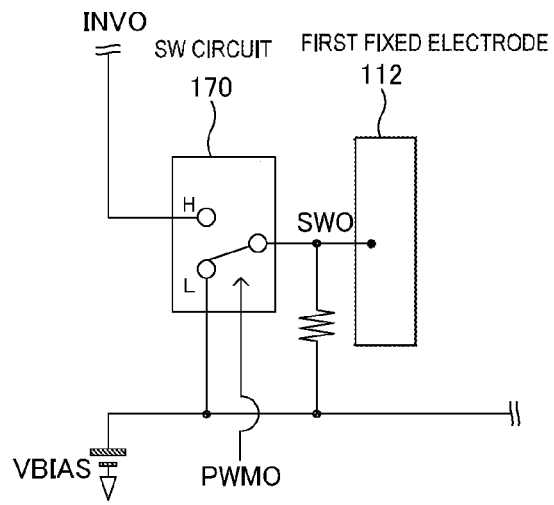
Figure 6C:
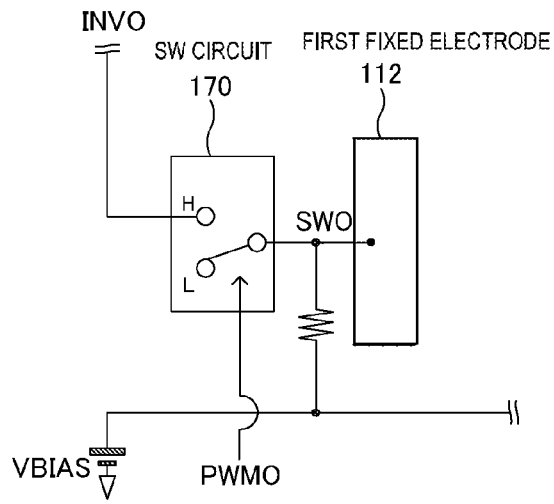

On the contrary, the bias voltage VBIAS may be applied to the first fixed electrode 112 without passing through the SW circuit 170, as shown in FIG. 6B. In this case, the L terminal of the SW circuit 170 may be connected to the DC voltage source or may not be connected to a DC voltage source by being floated, as shown in FIG. 6C.

By the way a somewhat large parasitic capacitance (e.g., about 30 pF) is present between the first fixed electrode 112 and the GND. Therefore, it is necessary to supply the inverting amplifier 130 with a current for driving the parasitic capacitance. This is a factor of increasing the consumption current.

In each of the above-described embodiments, it is sufficient to drive the parasitic capacitance only during the period in which the positive feedback loop is formed. Therefore, it is possible to perform an operation of increasing the drive capacity when the signal PWMO is H and decreasing the drive capacity when the signal PWMO is L.

Figure 7:
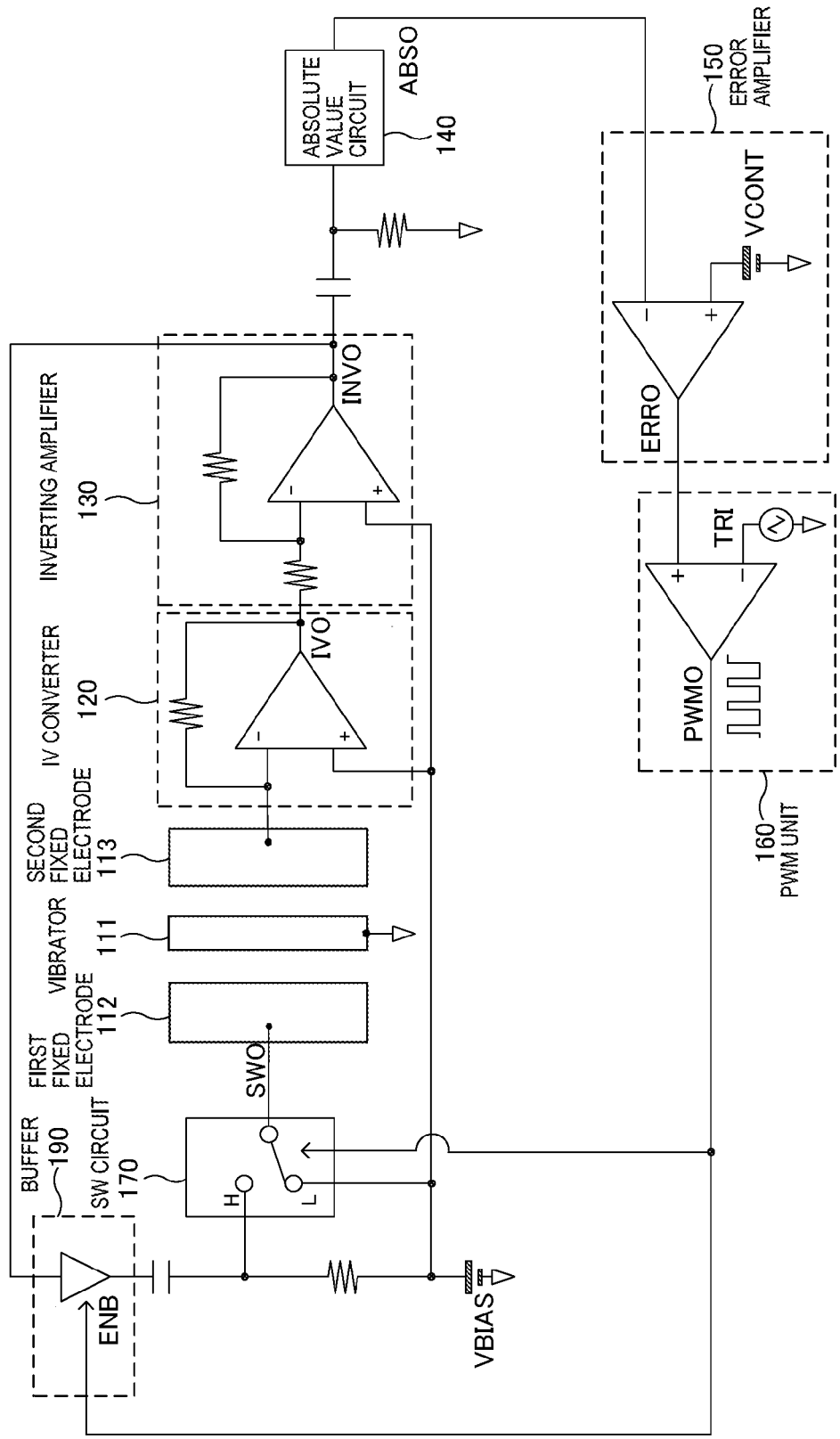
FIG. 7 is a view showing a modified example of each embodiment.
Figure 8:
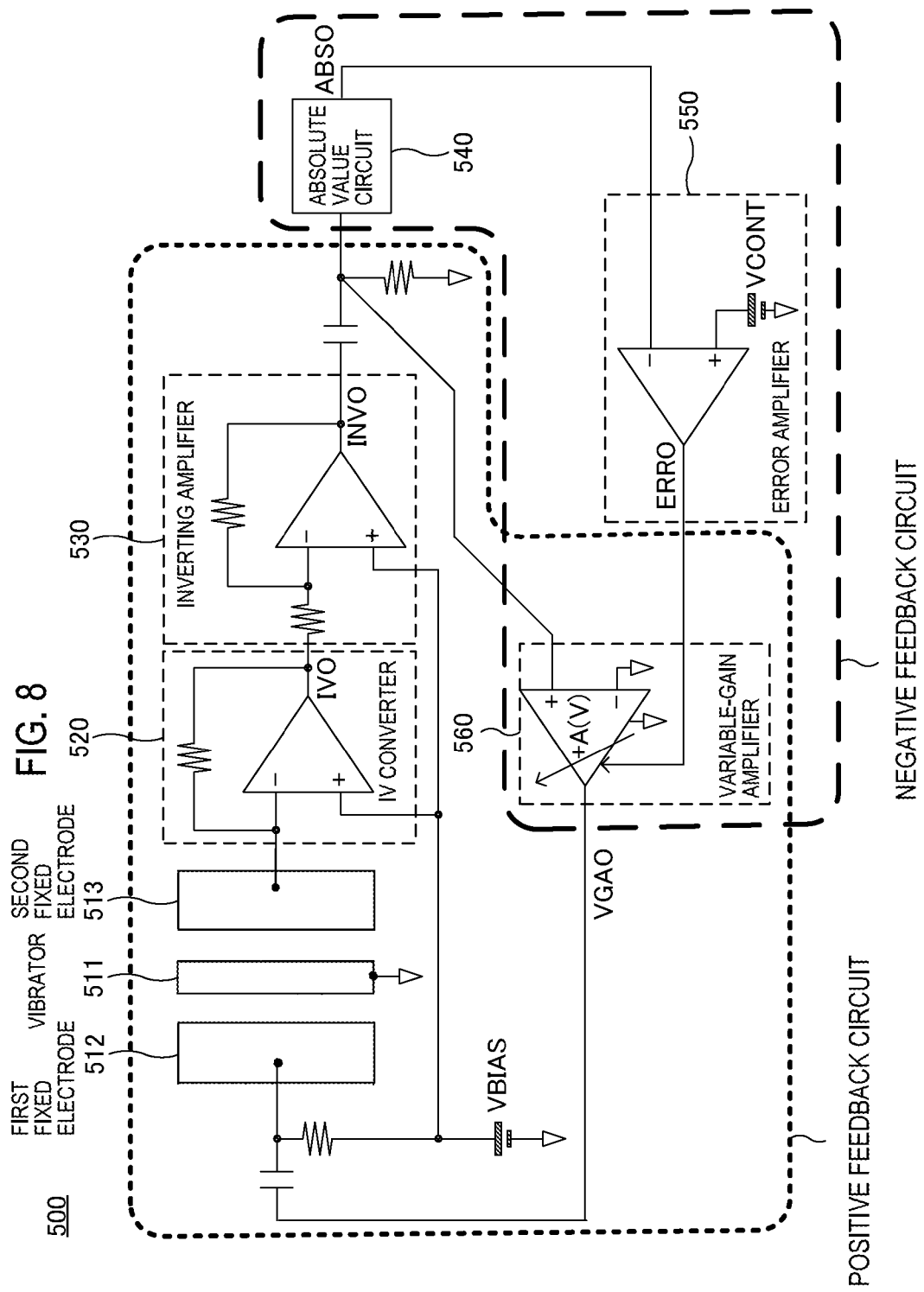
FIG. 8 is a view showing a configuration example of a related-art capacitive vibration type self-oscillation circuit.

Therefore, for example, as shown in FIG. 7, a buffer 190 having an enable function is placed between the inverting amplifier 130 and the SW circuit 170. Only when the signal PWMO is H, the buffer 190 is in an enable state to secure the drive capacity. Further, when the signal PWMO is L, the buffer 190 is in a disable state and the current is not consumed in the buffer 190. In this way, it is possible to reduce the consumption power. The buffer 190 having the enable function can be applied to all of the above-described embodiments.

What is claimed is:

1. A self-oscillation circuit comprising:
    a vibration unit, having a vibrator that generates an output based on vibration of the vibrator with an oscillation amplitude and at a vibration frequency;
    a positive feedback circuit that comprises the vibration unit and a positive feedback path which positively feeds back a signal, based on the output generated by vibration of the vibrator, to the vibration unit;
    a negative feedback circuit, which comprises a comparator and a pulse width modulation unit that generates a pulse-width-modulated signal having a frequency lower than the vibration frequency of the vibrator, based on a comparison result between a value corresponding to the oscillation amplitude of the vibrator and a reference value;
    a switch circuit which is coupled to receive the pulse-width modulated signal and is operative to switch between a connection and a disconnection of the positive feedback path to the vibration unit in response to the pulse-width-modulated signal; and
    a synchronization unit that comprises a flip-flop and a comparator and that is configured to synchronize switching of the switch circuit with the vibration of the vibrator.

2. The self-oscillation circuit according to claim 1, further comprising:
    a buffer provided in the positive feedback path, the buffer being switched between an enable state and a disable state by the pulse-width-modulated signal.

3. The self-oscillation circuit according to claim 1, wherein the negative feedback circuit generates the pulse-width-modulated signal such that the greater a difference between the value corresponding to the amplitude of the vibrator and the reference value is, the longer a pulse width is.

4. A self-oscillation circuit comprising:
    a vibration unit having a vibrator;
    a positive feedback path which positively feeds back a signal based on vibration of the vibrator to the vibration unit;
    a negative feedback circuit which generates a pulse-width-modulated signal having a frequency lower than a vibration frequency of the vibrator, based on a comparison result between a value corresponding to an amplitude of the vibrator and a reference value;
    a switch circuit which switches connection and disconnection of the positive feedback path to the vibration unit by the pulse-width-modulated signal; and
    a synchronization unit that comprises a flip-flop and a comparator and that is configured to synchronize switching of the switch circuit with the vibration of the vibrator,
    wherein the negative feedback circuit includes an error amplifier which compares the value corresponding to the amplitude of the vibrator with the reference value to output an error signal, and a PWM unit which performs pulse-width-modulation of the error signal.

5. The self-oscillation circuit according to claim 4, wherein the PWM unit includes a triangular wave oscillator which outputs a triangular wave having a frequency lower than the vibration frequency of the vibrator, and a comparator which compares the error signal with the triangular wave to generate the pulse-width-modulated signal.

6. A self-oscillation circuit comprising:
    a vibration unit having a vibrator;
    a positive feedback path which positively feeds back a signal based on vibration of the vibrator to the vibration unit;
    a negative feedback circuit which generates a pulse-width-modulated signal having a frequency lower than a vibration frequency of the vibrator, based on a comparison result between a value corresponding to an amplitude of the vibrator and a reference value; and
    a switch circuit which switches connection and disconnection of the positive feedback path to the vibration unit by the pulse-width-modulated signal,
    wherein the negative feedback circuit includes an AD converter which digitally converts the value corresponding to the amplitude of the vibrator, a digital error detection unit which compares the digitized value with the reference value to detect an error, a digital PWM unit which performs pulse width modulation of the detected error.

7. The self-oscillation circuit according to claim 6, wherein the digital error detection unit includes a subtractor which calculates a difference between the digitized value and the reference value and a digital filter which controls the digital PWM unit according to the difference.

* * * * *